United States Patent
Nagatomo

(10) Patent No.: US 12,308,820 B2
(45) Date of Patent: May 20, 2025

(54) ACOUSTIC WAVE DEVICE

(71) Applicant: Murata Manufacturing Co., Ltd., Nagaokakyo (JP)

(72) Inventor: Sho Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 384 days.

(21) Appl. No.: 17/863,447

(22) Filed: Jul. 13, 2022

(65) Prior Publication Data

US 2022/0345105 A1 Oct. 27, 2022

Related U.S. Application Data

(63) Continuation of application No. PCT/JP2020/049242, filed on Dec. 28, 2020.

(30) Foreign Application Priority Data

Jan. 20, 2020 (JP) .................................. 2020-006608

(51) Int. Cl.
*H03H 9/02* (2006.01)

(52) U.S. Cl.
CPC .... *H03H 9/02992* (2013.01); *H03H 9/02574* (2013.01)

(58) Field of Classification Search
CPC .. H03H 9/02; H03H 9/17; H03H 9/25; H03H 9/54; H03H 9/64
See application file for complete search history.

(56) References Cited

U.S. PATENT DOCUMENTS 7,281,304 B2 * 10/2007 Kim ..................... H03H 9/172
29/25.35
11,274,035 B2 * 3/2022 Gul ..................... B81B 7/0009
(Continued)

FOREIGN PATENT DOCUMENTS

CN 116208120 B * 7/2023
JP 2012257019 A 12/2012
(Continued)

OTHER PUBLICATIONS

International Search Report in PCT/JP2020/049242, mailed Mar. 9, 2021, 3 pages.
(Continued)

*Primary Examiner* — Andrea Lindgren Baltzell
*Assistant Examiner* — Alan Wong
(74) *Attorney, Agent, or Firm* — Keating & Bennett, LLP

(57) ABSTRACT

An acoustic wave device includes a semiconductor support including a principal surface, a piezoelectric layer on the principal surface of the semiconductor support, and an IDT electrode on a principal surface of the piezoelectric layer. The IDT electrode includes first and second busbars, and first and second electrode fingers. The IDT electrode includes first gaps between the first busbar and respective second electrode fingers. A recess is provided in at least a portion of the semiconductor support substrate overlapping the first gaps as viewed in plan. No recess is provided in at least a portion of the semiconductor support substrate overlapping the IDT electrode as viewed in plan. The recess opens toward the piezoelectric layer.

16 Claims, 6 Drawing Sheets

(56) References Cited

U.S. PATENT DOCUMENTS

| | | | |
|---|---|---|---|
| 11,722,122 B2* | 8/2023 | Goto | H03H 9/02842 |
| | | | 333/193 |
| 2015/0287905 A1 | 10/2015 | Umeda et al. | |
| 2019/0238114 A1 | 8/2019 | Kishimoto et al. | |
| 2020/0339414 A1* | 10/2020 | Gul | B81C 1/00174 |
| 2021/0159886 A1* | 5/2021 | Goto | H03H 9/25 |
| 2023/0013597 A1* | 1/2023 | Goto | H03H 9/02574 |

FOREIGN PATENT DOCUMENTS

| | | |
|---|---|---|
| JP | 2014110457 A | 6/2014 |
| JP | 2019021997 A | 2/2019 |
| WO | 2014087799 A1 | 6/2014 |
| WO | 2015005267 A1 | 1/2015 |
| WO | 2018096783 A1 | 5/2018 |
| WO | 2019111893 A1 | 6/2019 |

OTHER PUBLICATIONS

Written Opinion in PCT/JP2020/049242, mailed Mar. 9, 2021, 3 pages.

* cited by examiner

ACOUSTIC WAVE DEVICE

CROSS REFERENCE TO RELATED APPLICATIONS

This application claims the benefit of priority to Japanese Patent Application No. 2020-006608 filed on Jan. 20, 2020 and is a Continuation Application of PCT Application No. PCT/JP2020/049242 filed on Dec. 28, 2020. The entire contents of each application are hereby incorporated herein by reference.

BACKGROUND OF THE INVENTION

1. Field of the Invention

The present invention relates to an acoustic wave device.

2. Description of the Related Art

Acoustic wave devices have been widely used, for example, as filters for mobile phones. International Publication No. 2014/087799 discloses an example of an acoustic wave device. In the acoustic wave device, an IDT (interdigital transducer) electrode is formed on a piezoelectric member. The piezoelectric member is a multilayer body including a piezoelectric layer and a silicon containing substrate.

Japanese Unexamined Patent Application Publication No. 2014-110457 discloses an acoustic wave device in which an IDT electrode is formed on a piezoelectric substrate. The IDT electrode includes multiple electrode fingers and multiple dummy electrode fingers. The electrode fingers oppose respective dummy electrode fingers with gaps being interposed therebetween. An electric field is generated at each gap due to a potential difference between the electrode fingers and the dummy electrode fingers.

In the case where an acoustic wave device is formed by disposing the IDT electrode of Japanese Unexamined Patent Application Publication No. 2014-110457 on the piezoelectric member of International Publication No. 2014/087799, the electric field generated near each gap may reach not only the piezoelectric layer but also the silicon containing substrate. When the electric field passes through the silicon containing substrate, which is the semiconductor substrate, the silicon containing substrate produces a nonlinear response, which deteriorates the linear characteristics of the acoustic wave device.

SUMMARY OF THE INVENTION

Preferred embodiments of the present invention provide acoustic wave devices that each include a semiconductor support and that prevent linear characteristics being deteriorated easily.

An acoustic wave device according to a preferred embodiment of the present invention includes a semiconductor support including a principal surface, a piezoelectric layer directly or indirectly on the principal surface of the semiconductor support, and an IDT electrode on one principal surface of the piezoelectric layer. The IDT electrode includes a first busbar and a second busbar opposed to each other, first electrode fingers including respective first ends connected to the first busbar, and second electrode fingers including respective first ends connected to the second busbar. The second electrode fingers are interdigitated with the first electrode fingers. The IDT electrode also includes gaps between the first busbar and the second electrode fingers and also between the second busbar and the first electrode fingers. A cavity is provided in at least a portion of the semiconductor support, the portion overlapping the gaps as viewed in plan. No cavity is provided in at least a portion of the semiconductor support, the portion overlapping the IDT electrode as viewed in plan. The cavity opens toward the piezoelectric layer.

Accordingly, preferred embodiments of the present invention each provide an acoustic wave device that includes a semiconductor support and of which linear characteristics do not deteriorate easily.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In order to clarify the present invention, preferred embodiments of the present invention will be described with reference to the drawings.

The preferred embodiments described herein are provided as examples and configurations described in different preferred embodiments may be partially replaced or combined with one another.

Figure 1:
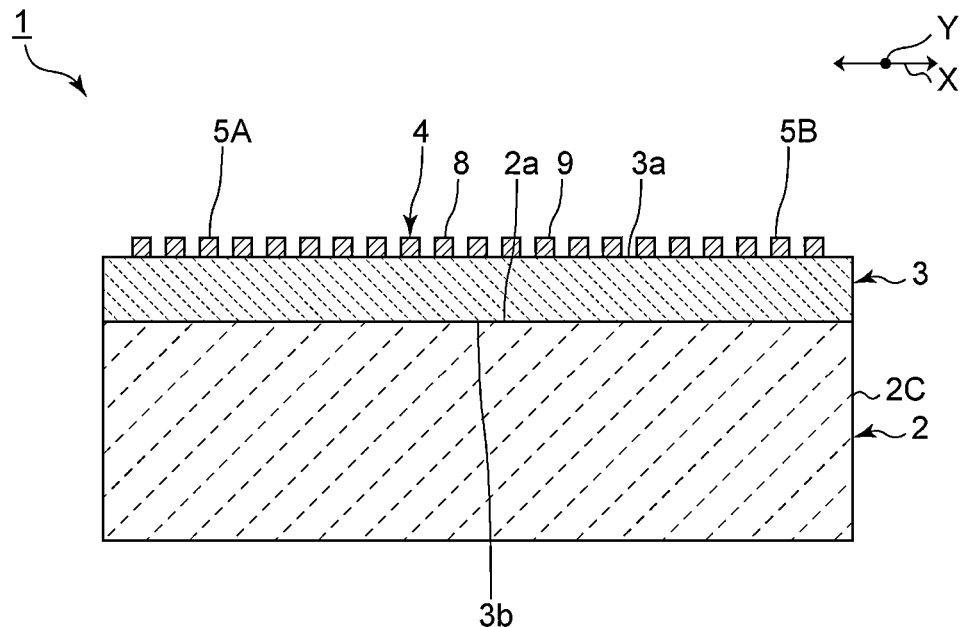
FIG. 1 is a cross-sectional front view illustrating an acoustic wave device according to a first preferred embodiment of the present invention.
Figure 2:
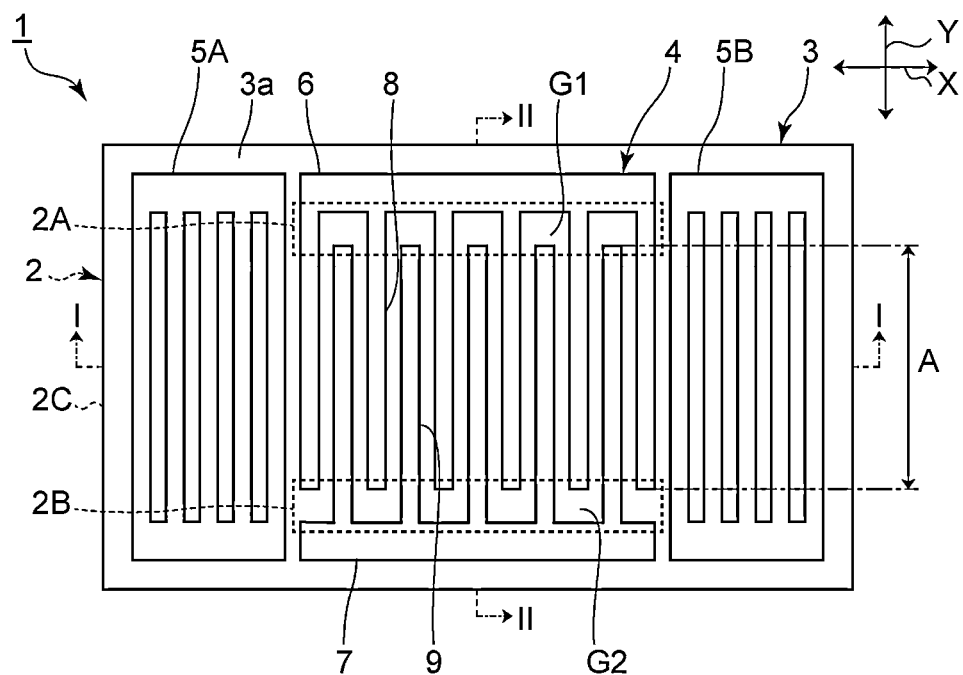
FIG. 2 is a plan view illustrating the acoustic wave device according to the first preferred embodiment of the present invention.

FIG. 1 is a cross-sectional front view of an acoustic wave device according to a first preferred embodiment of the present invention. FIG. 2 is a plan view of the acoustic wave device according to the first preferred embodiment. Note that FIG. 1 illustrates a section taken along line I-I in FIG. 2.

As illustrated in FIG. 1, an acoustic wave device 1 includes a semiconductor support substrate 2. The semiconductor support substrate 2 corresponds to a "semiconductor support". The semiconductor support substrate 2 includes a principal surface 2a. In the present preferred embodiment, the semiconductor support substrate 2 is, for example, a silicon substrate. The semiconductor support of the present invention is not limited to this, and may be a substrate that includes an appropriate semiconductor. For example, the semiconductor to be used in the semiconductor support is silicon, germanium, gallium arsenide, or indium phosphide.

A piezoelectric layer 3 is provided on the principal surface 2a of the semiconductor support substrate 2. The piezoelectric layer 3 includes a first principal surface 3a and a second principal surface 3b. The first principal surface 3a and the second principal surface 3b are opposed to each other. The second principal surface 3b is positioned closer to the semiconductor support substrate 2 than the first principal surface 3a. The first principal surface 3a corresponds to "one principal surface" of the piezoelectric layer 3. The piezoelectric substance to be used for the piezoelectric layer 3 is not specifically limited. For example, the piezoelectric layer 3 may include at least one of lithium tantalate, lithium niobate, aluminum nitride, zinc oxide, and rock crystal.

In the present preferred embodiment, the piezoelectric layer 3 is provided directly on the principal surface 2a of the semiconductor support substrate 2. The piezoelectric layer 3, however, may be provided on the principal surface 2a of the semiconductor support substrate 2 with another layer interposed therebetween.

An IDT electrode 4 is provided on the first principal surface 3a of the piezoelectric layer 3. An alternating current is applied to the IDT electrode 4, which drives the IDT electrode 4 to generate acoustic waves. A reflector 5A and a reflector 5B are provided on the first principal surface 3a of the piezoelectric layer 3 at respective sides of the IDT electrode 4 in the acoustic wave propagation direction. The reflector 5A and the reflector 5B define a pair. The acoustic wave device 1 of the present preferred embodiment is an acoustic wave resonator. More specifically, the acoustic wave device 1 is a surface acoustic wave resonator. The acoustic wave device of preferred embodiments of the present invention, however, is not limited to the acoustic wave resonator, and may be, for example, a filter device including multiple acoustic wave resonators or may be a multiplexer including the filter device.

The IDT electrode 4 includes a first busbar 6, a second busbar 7, multiple first electrode fingers 8, and multiple second electrode fingers 9. The first busbar 6 and the second busbar 7 are opposed to each other. The first electrode fingers 8 include respective ends connected to the first busbar 6. The second electrode fingers 9 include respective ends connected to the second busbar 7. The first electrode fingers 8 are interdigitated with the second electrode fingers 9. Here, the X direction is defined as the acoustic wave propagation direction. As illustrated in FIG. 2, when the IDT electrode 4 is viewed in the X direction, the first electrode fingers 8 overlap the second electrode fingers 9, and the overlapped region is denoted by an "overlap region A". The acoustic wave is excited in the overlap region A.

The IDT electrode 4 includes multiple first gaps G1 and multiple second gaps G2. The first gaps G1 are positioned between the first busbar 6 and respective second electrode fingers 9. The second gaps G2 are positioned between the second busbar 7 and respective first electrode fingers 8. More specifically, in the present preferred embodiment, the first busbar 6 opposes tip ends of the second electrode fingers 9 with respective first gaps G1 interposed therebetween. The second busbar 7 opposes tip ends of the first electrode fingers 8 with respective second gaps G2 interposed therebetween. When the Y direction is defined as the extending direction of the first electrode fingers 8 and the second electrode fingers 9, the first gaps G1 are positioned on extension lines of respective second electrode fingers 9 drawing in the Y direction. The second gaps G2 are positioned on extension lines of respective first electrode fingers 8 drawn in the Y direction.

Figure 3:
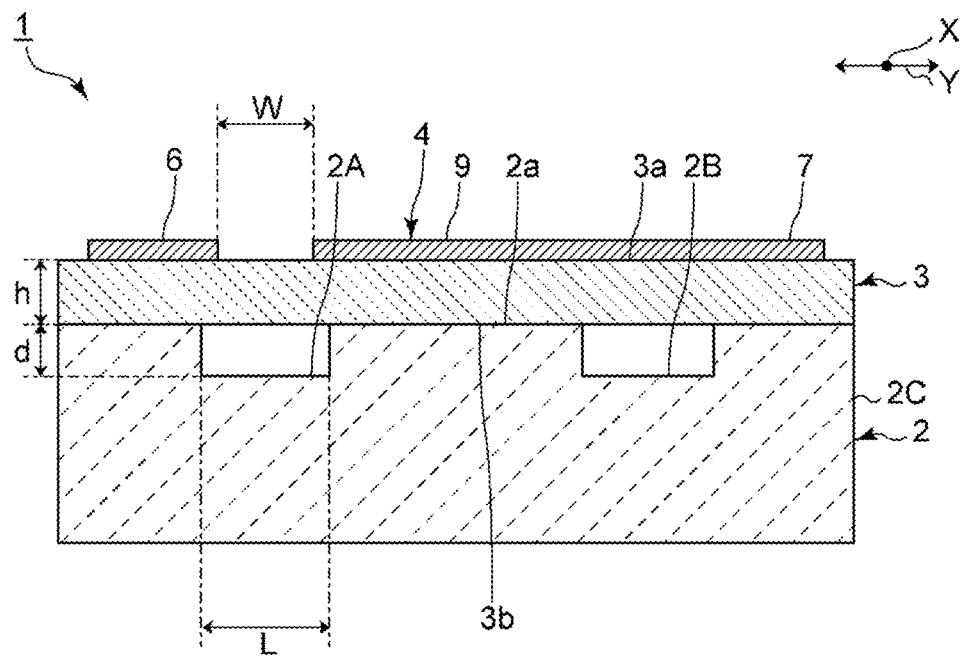
FIG. 3 is a cross-sectional view taken along line II-II in FIG. 2.

FIG. 3 is a cross-sectional view taken along line II-II in FIG. 2.

The semiconductor support substrate 2 includes a recess 2A and a recess 2B. The recess 2A and the recess 2B correspond to "cavities". The recess 2A and the recess 2B open toward the piezoelectric layer 3. The recess 2A and the recess 2B are closed by the piezoelectric layer 3. As illustrated in FIGS. 2 and 3, the recess 2A is provided in the semiconductor support substrate 2 so as to overlap the first gaps G1 as viewed in plan. The terms "viewed in plan" means that something is viewed from above in FIG. 1 or in FIG. 3. In the following description, when, for example, cavities or recesses overlap, or do not overlap, a portion of the IDT electrode as the cavities or the recesses are viewed in plan, the cavities or the recesses may be described simply as overlapping or not overlapping the IDT electrode unless otherwise specified.

As illustrated in FIG. 2, the recess 2A has a belt shape extending in the X direction as viewed in plan. More specifically, as viewed in plan, the recess 2A overlaps all of the first gaps G1 and also overlaps a portion of the first electrode fingers 8, tip end portions of the second electrode fingers 9, and a portion of the first busbar 6. The recess 2A does not overlap portions of the IDT electrode 4 other than the above portions.

On the other hand, the recess 2B is provided in the semiconductor support substrate 2 so as to overlap the second gaps G2 as viewed in plan. More specifically, as viewed in plan, the recess 2B overlaps all of the second gaps G2 and also overlaps a portion of the second electrode fingers 9, tip end portions of the first electrode fingers 8, and a portion of the second busbar 7. The recess 2B does not overlap portions of the IDT electrode 4 other than the above portions.

It is sufficient that the semiconductor support substrate 2 includes at least one of the recess 2A and the recess 2B provided therein. The shape of the recess 2A and the recess 2B is not limited to the belt shape. It is sufficient that as viewed in plan, the recess 2A overlaps at least a portion of at least one of the first gaps G1. Multiple recesses 2A may be arranged side by side in the X direction in the semiconductor support substrate 2. Similarly, it is sufficient that as viewed in plan, the recess 2B overlaps at least a portion of at least one of the second gaps G2. Multiple recesses 2B may be arranged side by side in the X direction.

The semiconductor support substrate 2 includes a semiconductor portion 2C. The semiconductor portion 2C is a portion of a semiconductor in the semiconductor support substrate 2. Note that in the acoustic wave device 1, the semiconductor portion 2C is a portion of the semiconductor support substrate 2 excluding the recess 2A and the recess 2B.

The features of the present preferred embodiment are summarized as follows. 1) The recess 2A or the recess 2B is provided in at least a portion of the semiconductor support substrate 2, the portion overlapping the first gaps G1 or the second gaps G2 as viewed in plan. 2) Neither the recess 2A nor the recess 2B is provided in at least a portion of the semiconductor support substrate 2, the portion overlapping the IDT electrode 4 as viewed in plan. As a result, the linear characteristics of the acoustic wave device 1 including the semiconductor support substrate 2 do not deteriorate easily. This also reduces or prevents the deterioration of the mechanical strength. The following describes this point in further detail by comparing the present preferred embodiment with a comparative example. Note that the comparative example is different from the first preferred embodiment in that the semiconductor support substrate does not include the recesses.

Figure 4:
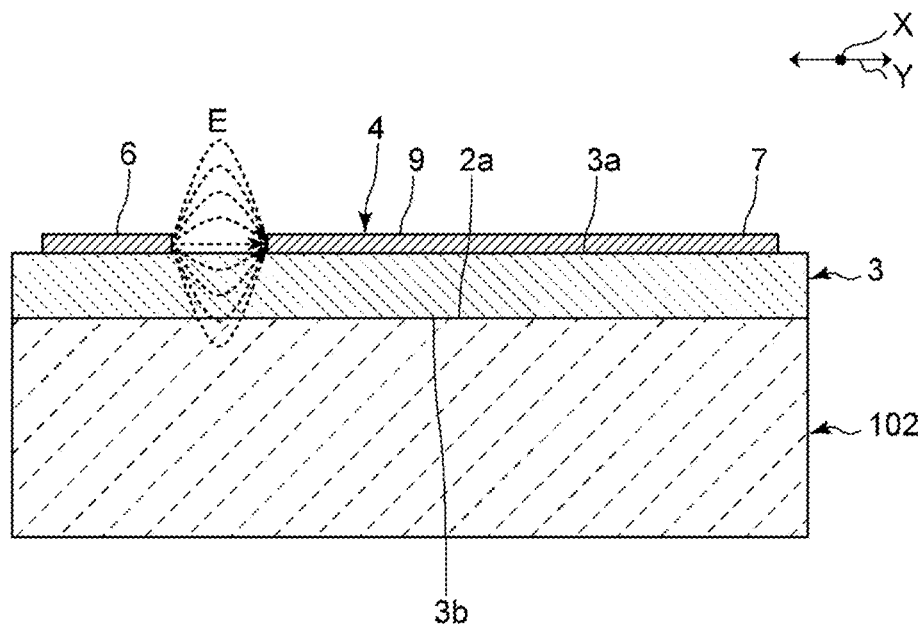
FIG. 4 is a cross-sectional view schematically illustrating an electric field generated near a first gap in a comparative example.
Figure 5:
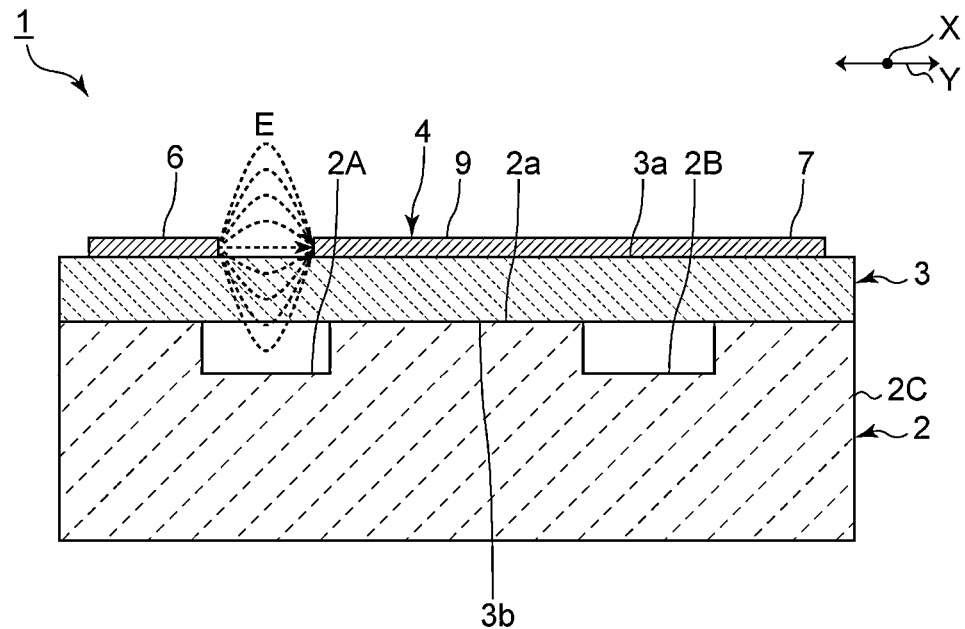
FIG. 5 is a cross-sectional view schematically illustrating an electric field generated near a first gap in the first preferred embodiment of the present invention.

FIG. 4 is a cross-sectional view schematically illustrating an electric field generated near a first gap in the comparative example. FIG. 5 is a cross-sectional view schematically illustrating an electric field generated near the first gap in the first preferred embodiment.

The first busbar 6 and the second electrode finger 9 illustrated in FIG. 4 are coupled to different potentials. Accordingly, an electric field E is generated at a first gap G1. The electric field E reaches not only the piezoelectric layer 3 but also the semiconductor support substrate 102. The electric field E passing through the semiconductor support substrate 102 causes a nonlinear response from the semiconductor support substrate 102, which deteriorates the linear characteristics of the acoustic wave device.

In the present preferred embodiment, however, the recess 2A is provided in the semiconductor support substrate 2 so as to overlap the first gap G1 as viewed in plan, as illustrated in FIG. 5. Accordingly, the electric field E passes through the recess 2A. This reduces the number of lines of electric force of the electric field E passing through the semiconductor portion 2C. The same occurs at each second gap G2. This reduces or prevents the nonlinear response from the semiconductor support substrate 2. Accordingly, this prevents the linear characteristics of the acoustic wave device 1 from deteriorating easily.

In the present preferred embodiment, neither the recess 2A nor the recess 2B is provided in at least a portion of the semiconductor support substrate 2, the portion overlapping the IDT electrode 4 as viewed in plan. Accordingly, the semiconductor support substrate 2 can support the piezoelectric layer 3 appropriately. In addition, the deterioration of the linear characteristics as described above can be reduced without providing, for example, a recess in the piezoelectric layer 3. Accordingly, the deterioration of the mechanical strength of the acoustic wave device 1 can be reduced or prevented.

The piezoelectric layer 3 may include a recess therein. Even in this case, the semiconductor support substrate 2 can support the piezoelectric layer 3 appropriately, which reduces or prevents the deterioration of the mechanical strength of the acoustic wave device 1. It is preferable, however, that the piezoelectric layer 3 includes no recess. This prevents the piezoelectric layer 3 from breaking easily.

It is preferable that as viewed in plan, the recess 2A overlaps a center of each first gap G1 in the Y direction as in the present preferred embodiment. As illustrated in FIG. 5, a central portion of the electric field E generated at the first gap G1 reaches the semiconductor support substrate 2 more deeply at the center of the first gap G1. Accordingly, the likelihood of the electric field E passing through the semiconductor portion 2C can be effectively reduced or prevented by providing the recess 2A so as to overlap the center of the first gap G1. As a result, the deterioration of the linear characteristics of the acoustic wave device 1 can be more effectively reduced or prevented.

It is also preferable that as viewed in plan, the recess 2B overlaps the center of each second gap G2 in the Y direction.

As illustrated in FIG. 3, when W denotes the length of the first gap G1 or the second gap G2 in the Y direction and h denotes the distance between the principal surface 2a of the semiconductor support substrate 2 and the first principal surface 3a of the piezoelectric layer 3, it is preferable to satisfy h<W. Note that the length W is defined as the length in the Y direction of the largest one of the first gaps G1 and the second gaps G2. In the thickness direction of the piezoelectric layer 3, the electric field E easily reaches a distance corresponding to the length W of the gap or less from the gap that generates the electric field E. Accordingly, if h<W, the electric field E generated at the first gap G1 or the second gap G2 easily reaches the semiconductor support substrate 2. Even in this case, the semiconductor support substrate 2 of the acoustic wave device 1 includes the recess 2A and the recess 2B, and the electric field E passes through the recess 2A and the recess 2B. Accordingly, this can reduce or prevent the likelihood of the electric field E passing through the semiconductor portion 2C. Thus, in the case of h<W, preferred embodiments of the present invention are especially favorable.

In the present preferred embodiment, the distance h is equal or substantially equal to the thickness of the piezoelectric layer 3. In the case where another layer is provided between the semiconductor support substrate 2 and the piezoelectric layer 3, the distance h is the thickness that includes the thickness of such a layer.

The recess 2A and the recess 2B define and function as cavities. When L denotes a length of each of the recess 2A and the recess 2B in the Y direction, it is preferable to satisfy W≤L. In this case, even when the position of the electric field E varies, the likelihood of the electric field E passing through the semiconductor portion 2C can be reduced or prevented more reliably. As a result, the deterioration of the linear characteristics of the acoustic wave device 1 can be reduced or prevented more reliably.

In this case, it is preferable that the recess 2A entirely or substantially entirely overlaps a plurality of first gaps G1 as viewed in plan. Similarly, it is preferable that the recess 2B entirely or substantially entirely overlaps a plurality second gaps G2 as viewed in plan. This reduces or prevents the likelihood of the electric field E passing through the semiconductor portion 2C more reliably.

When d denotes the dimension of each of the recess 2A and the recess 2B, which define and function as cavities, in the thickness direction of the semiconductor support substrate 2, it is preferable to satisfy d≥W−h. Because d+h≥W is satisfied for this case, the electric field E does not easily reach the bottoms of the recess 2A and the recess 2B. Accordingly, the deterioration of the linear characteristics of the acoustic wave device 1 can be effectively reduced or prevented.

As in the present preferred embodiment, it is preferable that neither the recess 2A nor the recess 2B is provided in a portion of the semiconductor support substrate 2 that overlaps a central portion of the IDT electrode 4 as viewed in plan. More specifically, as viewed in plan, a portion of the semiconductor support substrate 2 overlaps the central portion of the overlap region A of the IDT electrode 4 in the Y direction, and it is preferable that neither the recess 2A nor the recess 2B is provided in this portion of the semiconductor support substrate 2. In this case, the semiconductor support substrate 2 reliably supports the piezoelectric layer 3 and the IDT electrode 4. Accordingly, the deterioration of the mechanical strength of the acoustic wave device 1 can be effectively reduced or prevented. In addition, the IDT electrode 4 is driven to vibrate most in the central portion thereof, where heat is generated most readily. In the present preferred embodiment, however, the semiconductor support substrate 2 supports the central portion, and the semiconductor support substrate 2 dissipates the heat effectively. Accordingly, this makes the acoustic wave device 1 less vulnerable to breakage.

As illustrated in FIG. 2, it is preferable that as viewed in plan, the overlap area between the overlap region A and the recesses 2A and 2B preferably do not exceed about one half of the area of the overlap region A. This can reduce or prevent the deterioration of the mechanical strength of the acoustic wave device 1 more reliably and also can improve heat dissipation.

When $h_p$ denotes the thickness of the piezoelectric layer 3 and p denotes the pitch of the electrode fingers of the IDT electrode 4, it is preferable to satisfy $h_P \leq 2p$. The pitch of the electrode fingers is defined as the center-to-center distance between adjacent electrode fingers of the first electrode fingers 8 or of the second electrode fingers 9. When $h_P \leq 2p$, the Q value can be improved. Moreover, the electromechanical coupling coefficient can be increased for the main mode to be utilized by the acoustic wave device 1.

In the present preferred embodiment, as viewed in plan, the recess 2A that overlaps the first gaps G1 is provided separately from the recess 2B that overlaps the second gaps G2. A recess may be provided in the semiconductor support substrate 2 so as to overlap both of the first gaps G1 and the second gaps G2 as viewed in plan.

Figure 6:
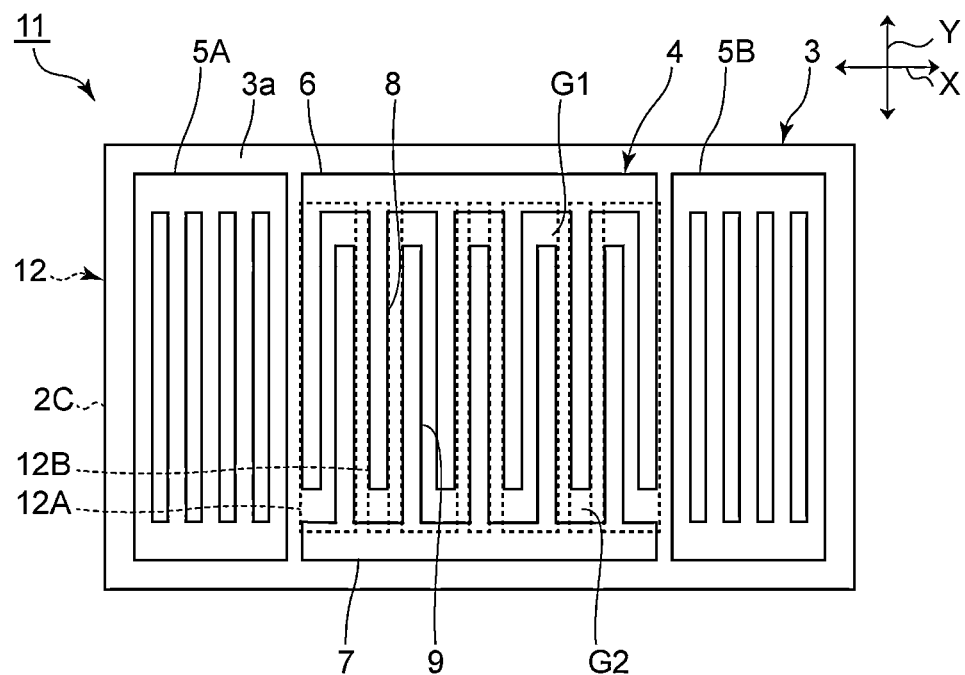
FIG. 6 is a plan view illustrating an acoustic wave device according to a modified example of the first preferred embodiment of the present invention.

FIG. 6 is a plan view of an acoustic wave device according to a modified example of the first preferred embodiment.

In the present modified example, a recess 12A and a recess 12B provided in a semiconductor support substrate 12 are configured differently compared with those of the first preferred embodiment. More specifically, as viewed in plan, the recess 12A and the recess 12B each overlap both of a portion of the first busbar 6 and a portion of the second busbar 7. As viewed in plan, the recess 12A overlaps both of a first gap G1 and a second gap G2. On the other hand, the recess 12B overlaps only one of the first gap G1 and the second gap G2. The semiconductor support substrate 12 includes multiple recesses 12A and multiple recesses 12B that are arranged alternately side by side in the X direction. The piezoelectric layer 3 is supported by the semiconductor support substrate 12 between the recesses 12A and 12B.

In the present modified example, as is the case for the first preferred embodiment, the linear characteristics of an acoustic wave device 11 including the semiconductor support substrate 12 do not deteriorate easily. The deterioration of the mechanical strength can be also reduced or prevented.

The arrangement of the recesses 12A and 12B in the semiconductor support substrate 12 is not limited to the above. For example, only the recesses 12A may be arranged side by side in the X direction. Alternatively, only the recesses 12B may be arranged side by side in the X direction. As viewed in plan, the recesses 12A and 12B need not overlap the first busbar 6 or the second busbar 7. Each recess 12A may overlap at least a portion of the first gap G1 and at least a portion of the second gap G2. Each recess 12B may overlap either at least a portion of the first gap G1 or at least a portion of the second gap G2.

In the acoustic wave device 11, each recess 12A overlaps one of the first gaps G1 and one of the second gaps G2 as viewed in plan. The recess 12A, however, may overlap one or more of the first gaps G1 and one or more of the second gaps G2 as viewed in plan.

The following describes a non-limiting example of a method of manufacturing the acoustic wave device 1 according to the present preferred embodiment.

FIGS. 7A to 7D are cross-sectional views for explaining the example method of manufacturing the acoustic wave device according to the first preferred embodiment.

Figure 7A:
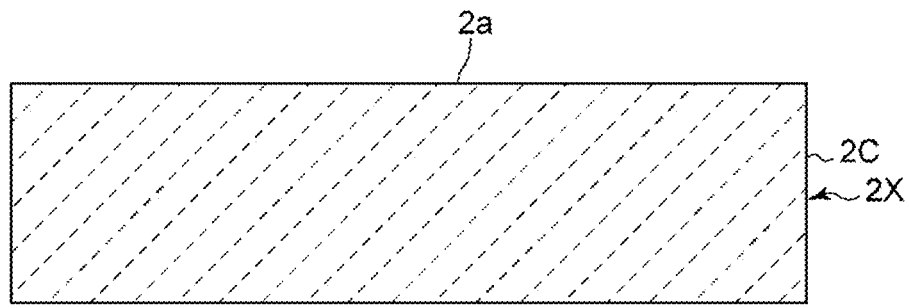
FIGS. 7A to 7D are cross-sectional views for explaining an example of a method of manufacturing the acoustic wave device according to the first preferred embodiment of the present invention.
Figure 7B:
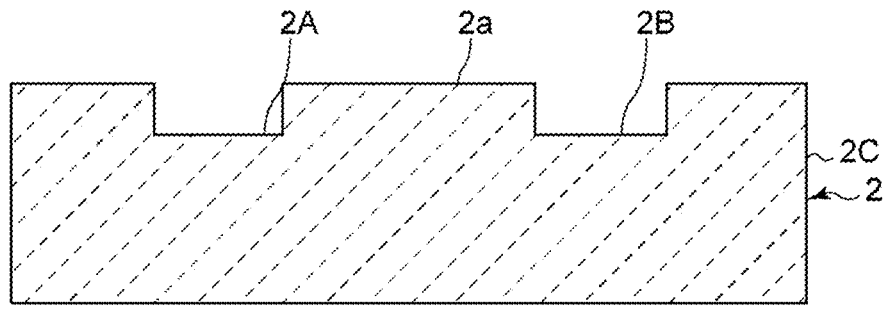

As illustrated in FIG. 7A, a semiconductor support substrate 2X is provided. Next, as illustrated in FIG. 7B, the recess 2A and the recess 2B are formed at the principal surface 2a of the semiconductor support substrate 2X. For example, the recess 2A and the recess 2B can be formed by dry etching. The semiconductor support substrate 2 of the present preferred embodiment is thus obtained.

Figure 7C:
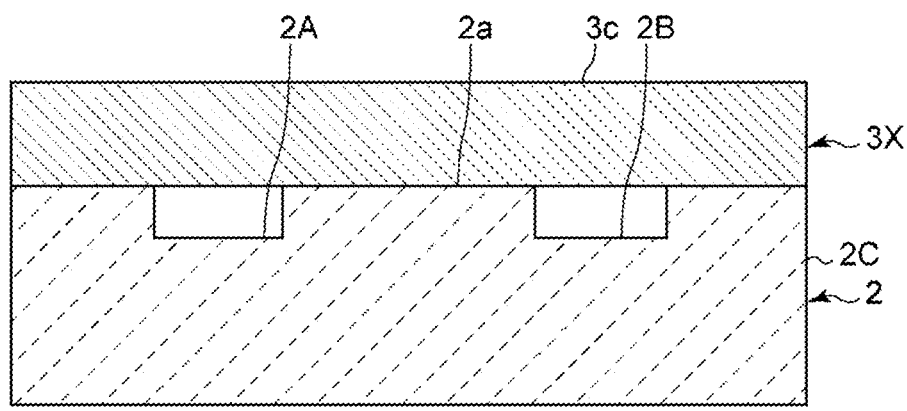
Figure 7D:
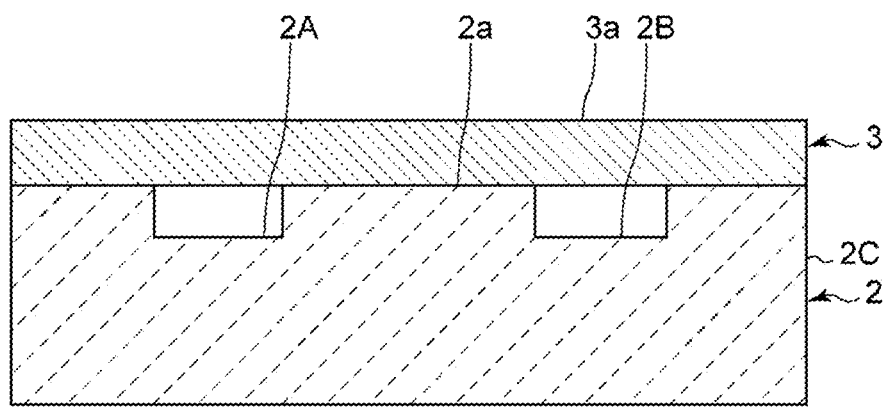

Next, as illustrated in FIG. 7C, a piezoelectric layer 3X is laminated on the principal surface 2a of the semiconductor support substrate 2. Subsequently, the surface 3c of the piezoelectric layer 3X is ground. The thickness of the piezoelectric layer 3X is thus adjusted to obtain the piezoelectric layer 3 of the present preferred embodiment as illustrated in FIG. 7D. The adjustment of the thickness enables the acoustic wave device to vibrate favorably in the main mode.

Next, the IDT electrode 4, the reflector 5A, and the reflector 5B, which are illustrated in FIG. 1, are formed on the first principal surface 3a of the piezoelectric layer 3. The IDT electrode 4, the reflector 5A, and the reflector 5B can be formed using, for example, the photolithography.

Figure 8:
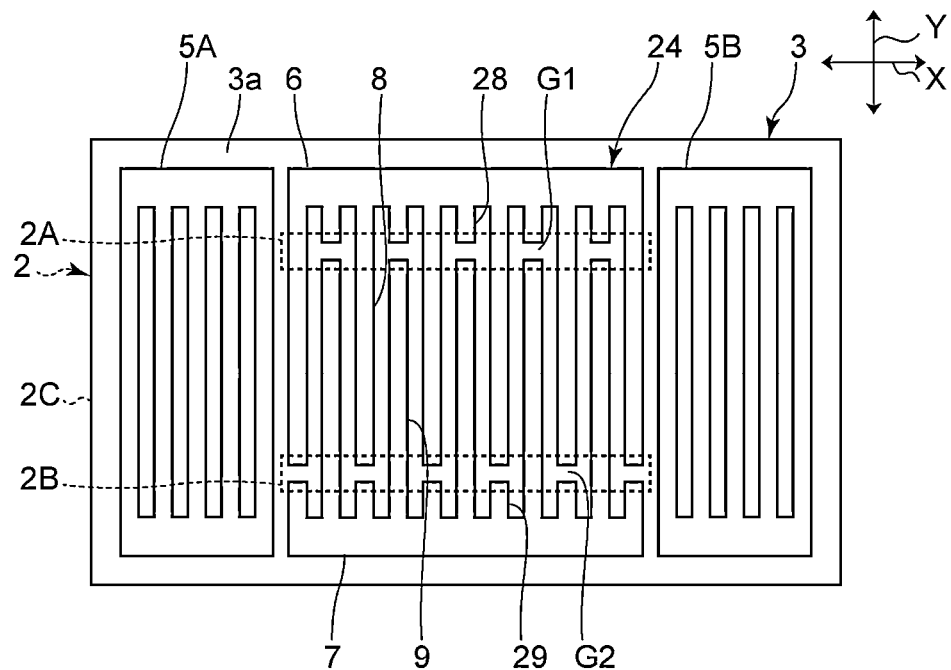
FIG. 8 is a plan view illustrating an acoustic wave device according to a second preferred embodiment of the present invention.

FIG. 8 is a plan view of an acoustic wave device according to a second preferred embodiment of the present invention.

The present preferred embodiment is different from the first preferred embodiment in that an IDT electrode 24 includes multiple first dummy electrode fingers 28 and multiple second dummy electrode fingers 29. Other configurations of the acoustic wave device of the present preferred embodiment are the same or substantially the same as those of the acoustic wave device 1 of the first preferred embodiment.

One end of each of the first dummy electrode fingers 28 are connected to the first busbar 6. One end of each of the second dummy electrode fingers 29 are connected to the second busbar 7. In the present preferred embodiment, the first dummy electrode fingers 28 oppose respective tip ends of the second electrode fingers 9 with the first gaps G1 being interposed therebetween. The second dummy electrode fingers 29 oppose respective first electrode fingers 8 with the second gaps G2 being interposed therebetween.

In the present preferred embodiment, the recess 2A overlaps multiple first gaps G1 as viewed in plan. The recess 2B overlaps multiple second gaps G2 as viewed in plan. As is the case for the first preferred embodiment, the electric field E is generated at each of the first gaps G1 and the second gaps G2, and the recess 2A and the recess 2B can effectively reduce or prevent the likelihood of the electric field E passing through the semiconductor portion 2C. As a result, the linear characteristics of the acoustic wave device including the semiconductor support substrate 2 do not deteriorate easily. Moreover, the semiconductor support substrate 2 supports the piezoelectric layer 3 appropriately, which reduces or prevents the mechanical strength from deteriorating easily.

Figure 9:
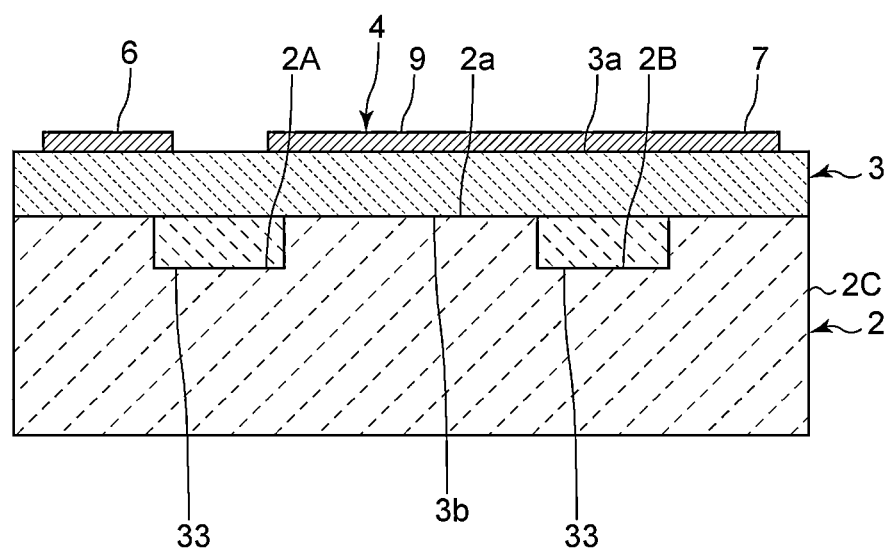
FIG. 9 is a cross-sectional view of an acoustic wave device according to a third preferred embodiment of the present invention, illustrating a section corresponding to that taken along line II-II in FIG. 2.

FIG. 9 is a cross-sectional view of an acoustic wave device according to a third preferred embodiment of the present invention, illustrating a section corresponding to that taken along line II-II in FIG. 2.

The present preferred embodiment is different from the first preferred embodiment in that an insulator 33 is disposed in the recess 2A and in the recess 2B. Other configurations of the acoustic wave device of the present preferred embodiment are the same or substantially the same as those of the acoustic wave device 1 of the first preferred embodiment.

As illustrated in FIG. 9, the recess 2A and the recess 2B are fully filled with the insulator 33. The recess 2A and the recess 2B, however, may be partially filled with the insulator 33. For example, the material of the insulator 33 may be silicon oxide, silicon nitride, silicon carbide, tantalum oxide, amorphous aluminum nitride, phosphosilicate glass (PSG), borosilicate glass (BSG), or polymer. When the electric field E generated at each one of the first gaps G1 or the second gaps G2 of the IDT electrode 4 passes through the insulator 33, the electric field E does not easily cause the nonlinear response from the insulator 33.

In the present preferred embodiment, as is the case for the first preferred embodiment, the linear characteristics of the acoustic wave device having the semiconductor support substrate 2 do not deteriorate easily. Moreover, the insulator 33 disposed in the recess 2A and the recess 2B can support the piezoelectric layer 3, thus reducing or preventing the deterioration of the mechanical strength.

Figure 10:
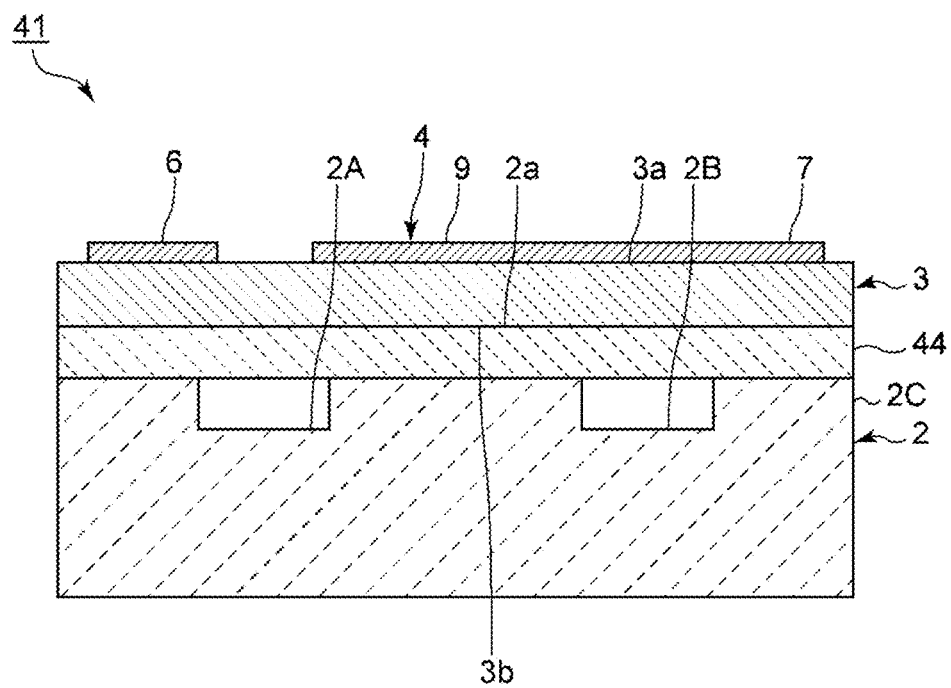
FIG. 10 is a cross-sectional view of an acoustic wave device according to a fourth preferred embodiment of the present invention, illustrating a section corresponding to that taken along line II-II in FIG. 2.

FIG. 10 is a cross-sectional view of an acoustic wave device according to a fourth preferred embodiment of the present invention, illustrating a section corresponding to that taken along line II-II in FIG. 2.

The present preferred embodiment is different from the first preferred embodiment in that an acoustic wave device 41 includes an intermediate layer 44. The intermediate layer 44 is provided between the semiconductor support substrate 2 and the piezoelectric layer 3. Other configurations of the acoustic wave device 41 of the present preferred embodiment are the same or substantially the same as those of the acoustic wave device 1 of the first preferred embodiment.

For example, the material of the intermediate layer 44 may be silicon oxide or tellurium oxide. It is preferable that the intermediate layer 44 is an insulator layer. In this case, when the electric field E generated at each one of the first gaps G1 and the second gaps G2 of the IDT electrode 4 passes through the intermediate layer 44, the electric field E does not easily cause the nonlinear response from the intermediate layer 44.

In the case of the acoustic wave device 41, the intermediate layer 44 includes, for example, silicon oxide. This enables the acoustic wave device 41 to decrease the absolute value of the temperature coefficient of frequency (TCF), which can improve the temperature characteristics of frequency.

In the present preferred embodiment, the above-described distance h is equal or substantially equal to the sum of the thickness $h_P$ of the piezoelectric layer 3 and the thickness of the intermediate layer 44. When $h_M$ denotes the thickness of the intermediate layer 44, $h=h_P+h_M$ is satisfied. Also in this case, as described above, it is preferable to satisfy h<W and d≥W−h.

In the present preferred embodiment, as is the case for the first preferred embodiment, the linear characteristics of the acoustic wave device 41 including the semiconductor support substrate 2 do not deteriorate easily. The deterioration of the mechanical strength can be also reduced or prevented.

If, for example, the insulator 33 is disposed in the recess 2A or in the recess 2B, as is the case for the third preferred embodiment, the intermediate layer 44 may be made of the same material as that of the insulator 33.

Figure 11:
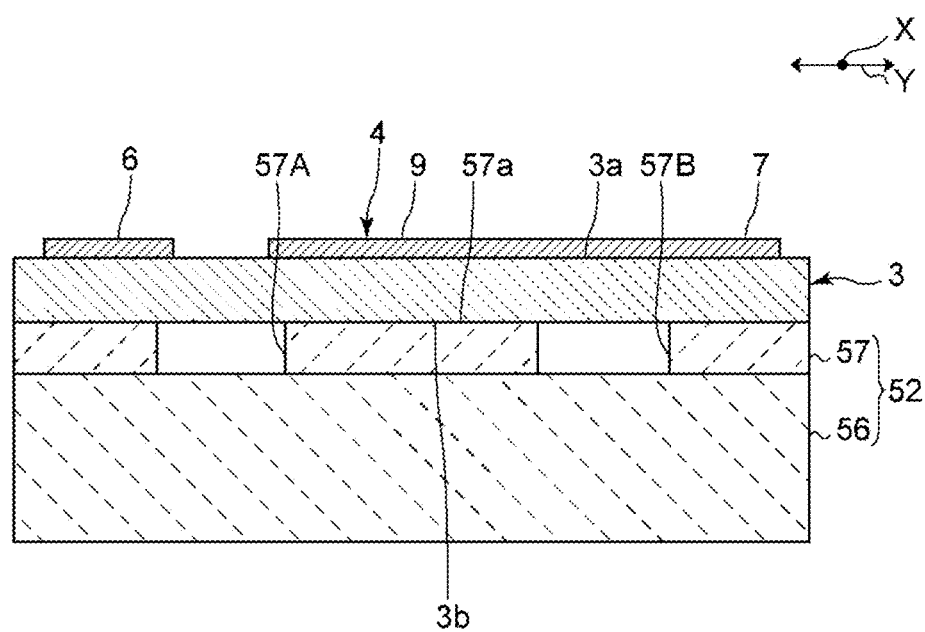
FIG. 11 is a cross-sectional view of an acoustic wave device according to a fifth preferred embodiment of the present invention, illustrating a section corresponding to that taken along line II-II in FIG. 2.

FIG. 11 is a cross-sectional view of an acoustic wave device according to a fifth preferred embodiment of the present invention, illustrating a section corresponding to that taken along line II-II in FIG. 2.

The present preferred embodiment is different from the first preferred embodiment in that a semiconductor support 52 is defined by a multilayer body including a support substrate 56 and a semiconductor layer 57 and in that the cavities are provided as a through hole 57A and a through hole 57B. The semiconductor layer 57 is provided on the support substrate 56. The piezoelectric layer 3 is provided on a principal surface 57a of the semiconductor layer 57 that defines and functions as the principal surface of the semiconductor support 52. Other configurations of the acoustic wave device of the present preferred embodiment are the same or substantially the same as those of the acoustic wave device 1 of the first preferred embodiment.

The through hole 57A and the through hole 57B are provided in the semiconductor layer 57. The cavities in the present preferred embodiment, which are the through hole 57A and the through hole 57B, open toward the piezoelectric layer 3 as is the case for the other preferred embodiments. One end of each of respective through holes 57A and 57B is closed by the support substrate 56 and the other end thereof is closed by the piezoelectric layer 3.

The through hole 57A and the through hole 57B have belt shapes as viewed in plan. The through hole 57A overlaps multiple first gaps G1 as viewed in plan. The through hole 57B overlaps multiple second gaps G2 as viewed in plan. The shapes of the through hole 57A and the through hole 57B are not specifically limited as is the case for the recess 2A and the recess 2B.

In the present preferred embodiment, no recess is provided in the support substrate 56. The support substrate 56, however, may include recesses that are provided so as to continue, for example, to the through hole 57A and the through hole 57B of the semiconductor layer 57.

For example, the semiconductor to be used in the semiconductor layer 57 is silicon, germanium, gallium arsenide, or indium phosphide.

For example, the material of the support substrate 56 may be a piezoelectric substance, such as aluminum oxide, lithium tantalate, lithium niobate, or rock crystal, a ceramic material, such as alumina, magnesia, silicon nitride, aluminum nitride, silicon carbide, zirconia, cordierite, mullite, steatite, or forsterite, a dielectric substance, such as sapphire, diamond, or glass, a semiconductor, such as silicon, germanium, gallium arsenide, or indium phosphide, or a resin.

In production of the semiconductor support 52, for example, a semiconductor layer is laminated on the support substrate 56. The through hole 57A and the through hole 57B are subsequently formed in the semiconductor layer, thus producing the semiconductor layer 57 of the present preferred embodiment. For example, the through hole 57A and the through hole 57B may be formed using laser light. Alternatively, the through hole 57A and the through hole 57B may be formed by machining or etching. The through hole 57A and the through hole 57B may be formed in the semiconductor layer 57 in advance, and the semiconductor layer 57 may be laminated on the support substrate 56.

In the present preferred embodiment, as is the case for the first preferred embodiment, the linear characteristics of the acoustic wave device including the semiconductor support 52 do not deteriorate easily. The deterioration of the mechanical strength can be also reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a semiconductor support including a principal surface;
   a piezoelectric layer directly or indirectly on the principal surface of the semiconductor support; and
   an IDT electrode on one principal surface of the piezoelectric layer; wherein
   the IDT electrode includes:
     a first busbar and a second busbar opposed to each other;
     first electrode fingers each including a respective one end connected to the first busbar; and
     second electrode fingers each including a respective one end connected to the second busbar, the second electrode fingers being interdigitated with the first electrode fingers;
   the IDT electrode includes gaps between the first busbar and the second electrode fingers and between the second busbar and the first electrode fingers;
   a cavity is provided in at least a portion of the semiconductor support, the portion overlapping the gaps as viewed in plan;
   no cavity is provided in at least a portion of the semiconductor support, the portion overlapping the IDT electrode as viewed in plan;
   the cavity opens toward the piezoelectric layer; and
   a portion of the IDT electrode that overlaps the cavity as viewed in plan is smaller than a portion of the IDT electrode that overlaps the at least a portion of the semiconductor support in which no cavity is provided as viewed in plan.

2. The acoustic wave device according to claim 1, wherein
   the first busbar opposes tip ends of the second electrode fingers with some of the gaps being interposed therebetween;
   the second busbar opposes tip ends of the first electrode fingers with others of the gaps being interposed therebetween; and
   the gaps are on respective extension lines of the first electrode fingers and the second electrode fingers, the extension lines being drawn from the tip ends thereof.

3. The acoustic wave device according to claim 1, wherein
   the IDT electrode includes:
     first dummy electrode fingers each including a respective one end connected to the first busbar; and
     second dummy electrode fingers each including a respective one end connected to the second busbar;
   the first dummy electrode fingers oppose respective tip ends of the second electrode fingers with some of the gaps being interposed therebetween;
   the second dummy electrode fingers oppose respective tip ends of the first electrode fingers with others of the gaps being interposed therebetween; and
   the gaps are on respective extension lines of the first electrode fingers and the second electrode fingers, the extension lines being drawn from the tip ends thereof.

4. The acoustic wave device according to claim 1, wherein, as viewed in plan, the cavity overlaps a center of at least one of the gaps, the center being defined with respect to an extending direction of the first electrode fingers and the second electrode fingers.

5. The acoustic wave device according to claim 1, wherein, when W denotes a length of each one of the gaps in the extending direction of the first electrode fingers and the second electrode fingers and h denotes a distance between the principal surface of the semiconductor support and the one principal surface of the piezoelectric layer, $h<W$ is satisfied.

6. The acoustic wave device according to claim 1, wherein, when W denotes the length of each one of the gaps in the extending direction of the first electrode fingers and the second electrode fingers and L denotes a length of the cavity in the extending direction of the first electrode fingers and the second electrode fingers, $W \leq L$ is satisfied.

7. The acoustic wave device according to claim 1, wherein, when W denotes the length of each one of the gaps in the extending direction of the first electrode fingers and the second electrode fingers, h denotes the distance between the principal surface of the semiconductor support and the one principal surface of the piezoelectric layer, and d denotes a dimension of the cavity in a thickness direction of the semiconductor support, $d \geq W-h$ is satisfied.

8. The acoustic wave device according to claim 1, wherein no cavity is provided in a portion of the semiconductor support, the portion overlapping a central portion of the IDT electrode as viewed in plan.

9. The acoustic wave device according to claim 1, wherein an insulator is located in at least a portion of the cavity.

10. The acoustic wave device according to claim 1, wherein when p denotes a pitch of electrode fingers of the IDT electrode and $h_p$ denotes a thickness of the piezoelectric layer, $h_p \leq 2p$ is satisfied.

11. The acoustic wave device according to claim 1, further comprising an intermediate layer between the semiconductor support and the piezoelectric layer.

12. The acoustic wave device according to claim 11, wherein the intermediate layer includes silicon oxide.

13. The acoustic wave device according to claim 1, wherein the semiconductor support is a semiconductor support substrate.

14. The acoustic wave device according to claim 1, wherein the semiconductor support includes a support substrate and a semiconductor layer on the support substrate.

15. The acoustic wave device according to claim 1, wherein the semiconductor support includes silicon.

16. The acoustic wave device according to claim 1, wherein the piezoelectric layer includes at least one of lithium tantalate, lithium niobate, aluminum nitride, zinc oxide, and rock crystal.

* * * * *